United States Patent [19]

Orthmann

[11] Patent Number: 5,729,053
[45] Date of Patent: Mar. 17, 1998

[54] APPARATUS AND METHOD FOR FLAT CIRCUIT ASSEMBLY

[75] Inventor: Kurt Orthmann, Munich, Germany

[73] Assignee: Texas Instruments Incorporated, Dallas, Tex.

[21] Appl. No.: 676,876

[22] Filed: Jul. 3, 1996

Related U.S. Application Data

[62] Division of Ser. No. 281,867, Jul. 27, 1994, Pat. No. 5,600,175.
[51] Int. Cl.$^6$ .................................................. H01L 27/02
[52] U.S. Cl. ............................ 257/724; 257/532; 257/924
[58] Field of Search ............................ 257/684, 723, 257/724, 727, 924, 532, 535; 174/52; 361/820

[56] References Cited

U.S. PATENT DOCUMENTS

| | | | |
|---|---|---|---|
| 4,577,214 | 3/1986 | Schaper | 257/724 |
| 4,907,062 | 3/1990 | Fukushima | 257/684 |
| 5,440,171 | 8/1995 | Miyano et al. | 257/700 |
| 5,608,261 | 3/1997 | Bhattacharyya | 257/700 |

FOREIGN PATENT DOCUMENTS

| | | | |
|---|---|---|---|
| 4-245467 | 9/1992 | Japan | 257/684 |

*Primary Examiner*—Donald Monin
*Attorney, Agent, or Firm*—Rebecca Mapstone-Lake; James C. Kesterson; Richard L. Donaldson

[57] ABSTRACT

A thin and flat integrated circuit assembly (10, 40) may be achieved by using a thin carrier (20) with shallow cavities (22, 24) for holding the integrated circuits (16) and/or discrete circuit components (14). The integrated circuits (16) and/or circuit components (14) may be friction fitted in the cavities (22, 24) or they may be secured therein by the use of adhesives and/or solder. Electrical connection between the integrated circuits (16) and circuit components (14) may be done with wire bonding, ribbon bonding, tape-automated bonding, lead frames, flip chip bonding, and/or conductive gluing of leads. The circuit assembly may then be accommodated into a credit card-sized packaging with standard dimensions set by the International Standards Organization.

22 Claims, 2 Drawing Sheets

APPARATUS AND METHOD FOR FLAT CIRCUIT ASSEMBLY

This is a Divisional of application Ser. No. 08/281,867, filed Jul. 27, 1994, now U.S. Pat. No. 5,600,175.

TECHNICAL FIELD OF THE INVENTION

This invention relates in general to the field of circuit assembly. More particularly, the present invention relates to apparatus and a method for circuit assembly to achieve a thin and flat profile.

BACKGROUND OF THE INVENTION

The integrated circuit technology has shrunken electronic circuits to the micron and submicron level. Surface mount technologies improved the printed circuit board density. The application specific integrated circuit (ASIC) put electronic circuits that occupied a printed circuit board into a single chip. Through these advances, the miniature size of the integrated circuit greatly enhanced its versatility and enabled its application to usage previously believed to be impossible.

The International Standards Organization (ISO) has established the standards of the credit card or personal identification card. These cards are equipped with a readable magnetic strip to provide storage and retrieval of information. Usage of these cards has expanded to debit cards, telephone calling cards, company personal identification badges, automated teller machine banking cards, vending cards, etc. However, these cards are not without disadvantages. These cards can only be read with a magnetic strip reader by passing the magnetic strip through it. Often a card must be inserted and passed through the reader repeatedly due to improper positioning or operation. Because the magnetic strip medium resides on the surface of the card, it is easily damaged due to improper handling and storage of the card. It is therefore desirable to provide a card that may be read with speed and in a contactless manner. Moreover, it is desirable to provide "smart" cards with added capabilities other than the basic storage and retrieval of data.

The ISO sets the standard dimensions for the credit card, which are 86×54×0.76 mm. For embedding integrated circuits therein, the critical dimension is the thickness of the card, which is 0.76 millimeters (mm) or 760 microns ($\mu$m). With capacitor thickness of approximately 500 $\mu$m, integrated circuit die of approximately 300 $\mu$m, and the required card packaging material of approximately 250 $\mu$m, typical integrated circuit assembly methods and techniques based on surface mount devices mounted on printed circuit boards or substrates are not applicable.

Accordingly, it is desirable to achieve an assembly of integrated circuits that can be accommodated within the standard dimensions of the ISO credit card.

SUMMARY OF THE INVENTION

In accordance with the present invention, apparatus and a method for integrated circuit assembly are provided which substantially eliminate or reduce disadvantages and problems associated with prior assembly techniques.

In one aspect of the present invention, a thin and flat integrated circuit assembly may be achieved by using a thin carrier with shallow cavities for holding the integrated circuits, circuit components and/or discrete components. The integrated circuits and/or circuit components may be friction fitted in the cavities or they may be secured therein by the use of adhesives. Electrical connection between the integrated circuits and circuit components may be done with wire bonding, ribbon bonding, tape-automated bonding, lead frames, and/or flip chip bonding. The circuit assembly may then be accommodated into a credit card-sized packaging with standard dimensions set by the International Standards Organization.

In another aspect of the present invention, a transponder arrangement is assembled on a thin carrier with cavities so that the entire assembly may be accommodated within a credit card-sized packaging.

BRIEF DESCRIPTION OF THE DRAWINGS

For a better understanding of the present invention, reference may be made to the accompanying drawings, in which.

DETAILED DESCRIPTION OF THE INVENTION

Figure 1:
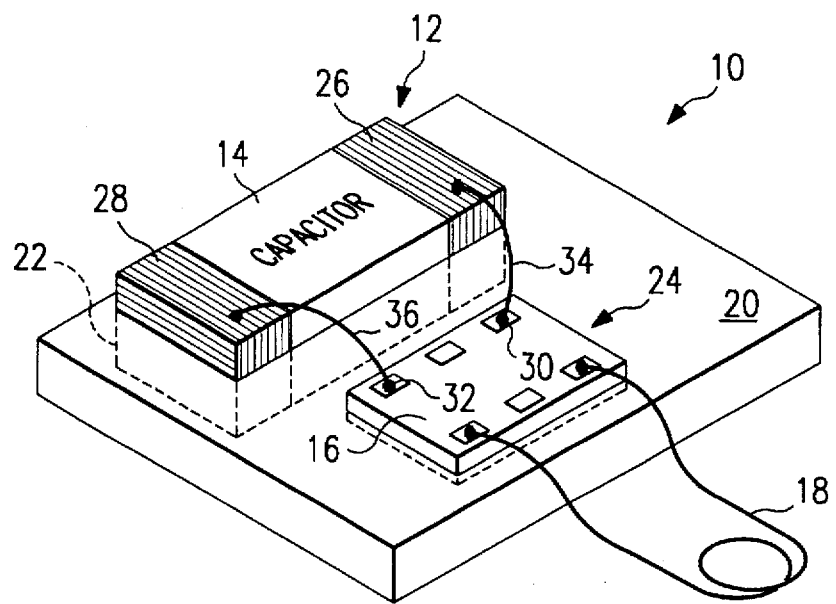
FIG. 1 is an elevational view of an integrated circuit assembly according to one embodiment of the invention.

FIG. 1 shows a flat assembly 10 of integrated circuits for packaging into the dimensions of a credit card according to one embodiment of the invention. The electronic circuit 12 shown is a transponder arrangement which includes a capacitor 14, an application specific integrated circuit die 16, and an antenna 18. The transponder circuit 12 is capable of receiving interrogation pulses generated and transmitted from an interrogation unit, and respond with appropriate data. Details of the transponder circuit 12 and operations thereof may be found in U.S. Pat. No. 5,053,774, titled "Transponder Arrangement" and issued to Schuermann et al. on Oct. 1, 1991.

Instead of using a printed circuit board and adhesives to bond the circuit components onto the board, a carrier 20 with shallow cavities 22 and 24 is provided. To reduce the overall height of the assembly, cavity 22 for accommodating capacitor 14 may include a through hole, so that the total height does not exceed 500 $\mu$m and the total thickness of the card does not exceed 760 $\mu$m. Carrier 20 is constructed of an appropriate materials such as ceramics, plastics, insulated metals, insulators, etc. Suitable ceramics include silicon carbide (SiC), aluminum nitride, beryllia (BeO), and alumina ($Al_2O_3$). Suitable insulated metal includes aluminum with epoxy or polyimide. Preferably, the thermal expansion coefficient of carrier 20 is near or equal to that of the circuit components 14 and 16. Alternatively, cavities 22 and 24 may be sized such that sufficient space is provided to compensate for the different expansion rates of carrier 20 and circuit components 14 and 16. It may be preferable to combine both techniques to properly accommodate the circuit components 14 and 16.

As shown, capacitor 14 is positioned into cavity 22, and die 16 is positioned into cavity 24. Capacitor 14 and die 16 may be secured into cavities 22 and 24, respectively by a number of ways. The size of cavities 22 and 24 may be such that circuit components 14 and 16 are friction fitted therein. Solder, solder paste or a suitable glue may be dispensed into the cavities or onto the cavity walls prior to or after circuit component placement. The solder or adhesive may thereafter be cured by a suitable process to fix capacitor 14 and die 16 securely in cavities 22 and 24 to withstand further handling. Note that portions of capacitor 14 and die 16 are outside of the cavities to facilitate electrical connections therebetween.

Capacitor 14, die 16, and antenna 18 are then electrically connected to form transponder circuit 12. Electrical connection may be made by wire bonding. As shown, wires 34 and 36 directly connect terminals 26 and 28 of capacitor 14 to chip pads 30 and 32 of die 16. Additional electrical connection methods include ribbon bonding as known in the art. A flexible substrate with conductive leads such as TAB (tape-automated bonding), flip chip or lead frame as known in the art may also be used to connect die 16 to capacitor 14. Note that when flexible substrates are used, bumps are typically placed on chip pads 30 and 32 for proper connection. The bumps may be constructed from solder, copper, gold, and the like. Antenna 18 may be electrically bonded to die 16 directly on the pads or on metallic plates formed on the die by techniques such as ultrasonic, resistance welding, thermo-compression and/or conductive gluing as known in the art. Alternatively, die 16 may be surface mounted onto carrier 20 if the total height does not exceed 500 μm.

Figure 2:
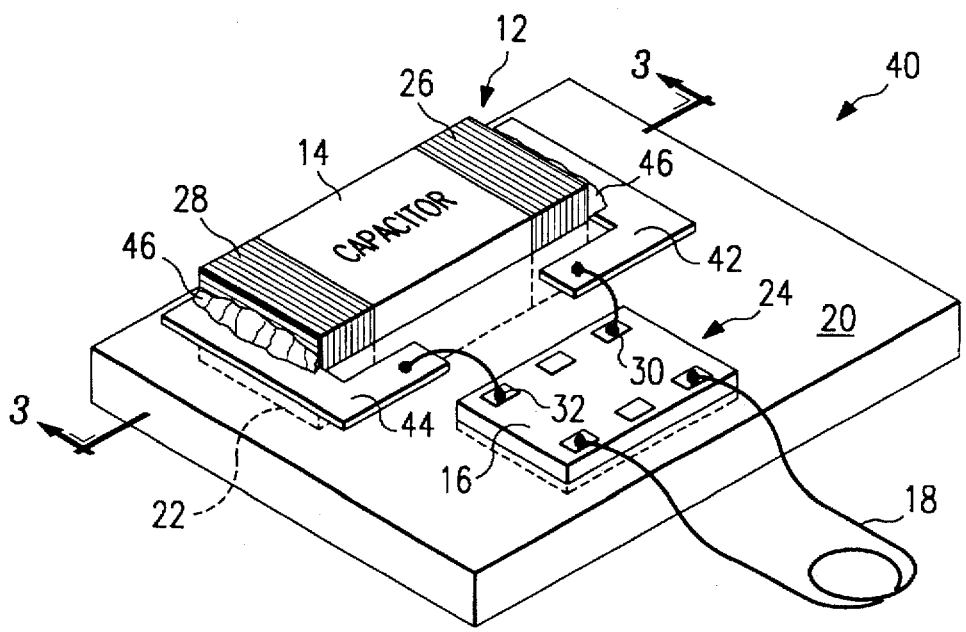
FIG. 2 is an elevational view of an integrated circuit assembly according to another embodiment of the invention.
Figure 3:
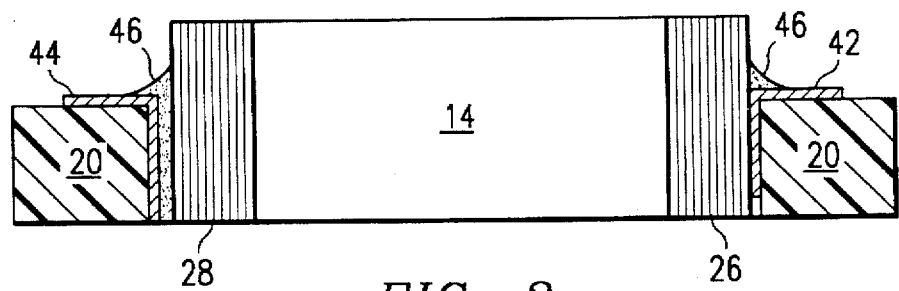
FIG. 3 is a cross-sectional view of the integrated circuit assembly in FIG. 2 along line 3—3.

Referring to FIG. 2, an alternate embodiment 40 of the integrated circuit assembly is shown. Capacitor 14 is shown placed in cavity 22 with metallic leads or caps 42 and 44 formed therein. FIG. 3 shows a cross-section of capacitor 14 and metallic caps 42 and 44. Metallic caps 42 may be constructed by surface metallization or application of conductive pastes. Suitable cap material includes copper, silver, aluminum, tungsten, molybdenum, and other metals of proper thermal conductivity and coefficient of thermal expansion characteristics. As shown, metallic caps 42 and 44 extend below the top surface of carrier 20 along the vertical walls of cavity 22 to ensure adequate contact with terminals 26 and 28 of capacitor 14. Metallic caps 42 and 44 further extends beyond the cavity openings along the top surface of carrier 20. A small amount of adhesive may be dispensed in cavity 22 prior to positioning capacitor 14 therein. The adhesive is then cured. Thereafter, a conductive adhesive 46 may be used to further secure capacitor 14 in the cavity and ensure proper electrical connection by dispensing the adhesive at the cap-capacitor joint or interface and cured. Proper electrical connection may also be made by placing an appropriate amount of solder paste at the cap-capacitor interface and heating the solder paste with a suitable heat source. Note that solder or another suitable conductive adhesive 46 may be used to fill any gap between cap 42 and capacitor 14.

The attachment of die 16 to carrier may be performed as described above. Wire bonding, ribbon bonding, TAB, lead frame, and/or flip chip techniques are then used to make the proper connections between die 16 and caps 42 and 44 which are connected electrically to the terminals of capacitor 14. Antenna 18 is attached by bonding or welding as discussed above.

Constructed in this manner, the total height of the circuit is between 500 μm and 600 μm, where capacitor thickness is approximately 500 μm and carrier thickness is between 200 and 400 μm. With the outer packaging thickness, the total thickness of the card should be within the standard thickness of 760 μm as required by the International Standards Organization.

Figure 4:
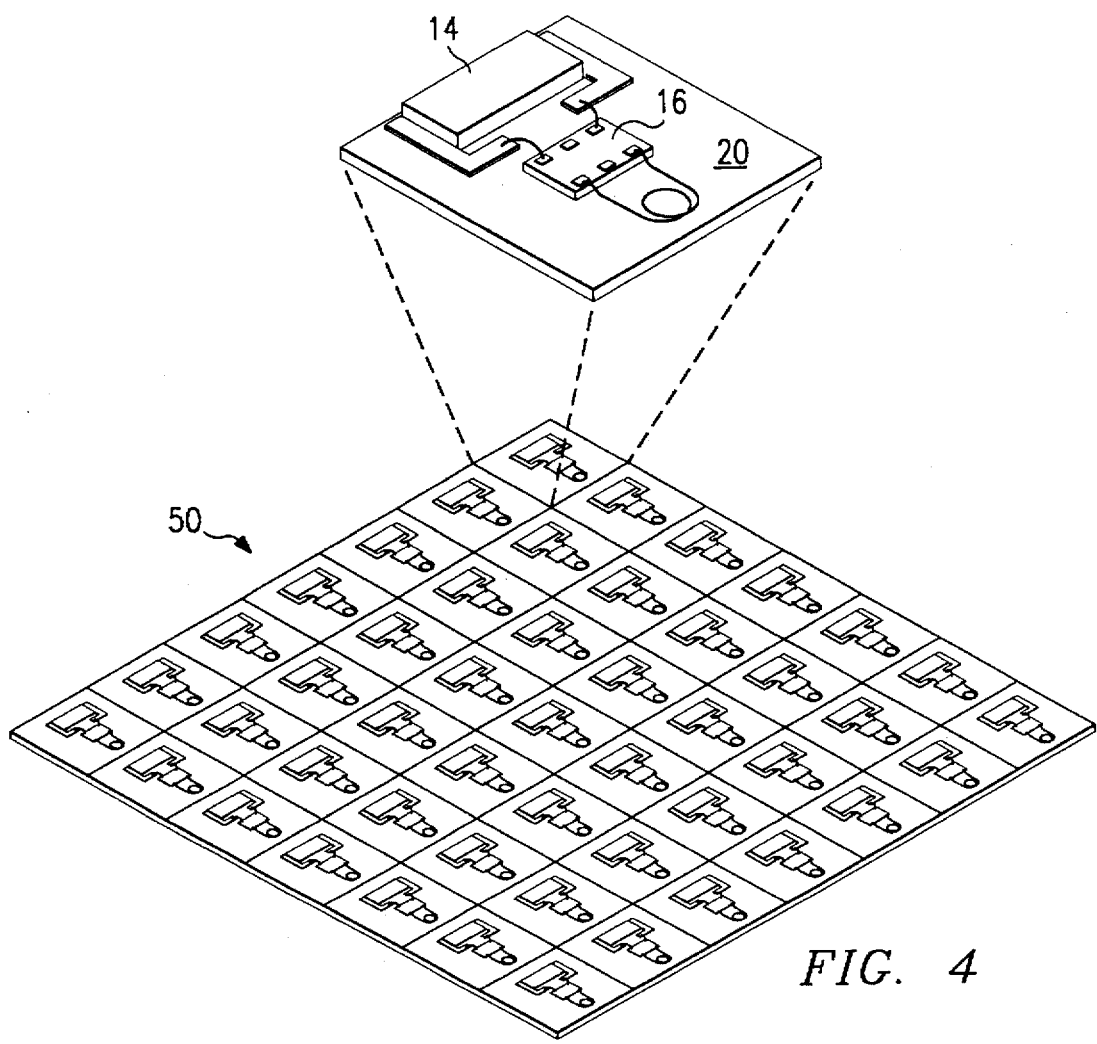
FIG. 4 is an elevational view of a multiple circuit assembly set up.

Referring to FIG. 4, a waffle packing assembly 50 is shown where multiple circuits may be formed by mass assembly. After the circuits are formed the carriers may then be divided and cut into individual carrier units carrying one circuit. Note that antennas 18 may be attached to dice 16 before or after separating out the individual carrier units.

Although the present invention has been described in detail, it should be understood that various changes, substitutions and alterations can be made thereto without departing from the spirit and scope of the present invention as defined by the appended claims.

What is claimed is:

1. A batteryless flat integrated circuit assembly, comprising:

at least one integrated circuit;

a capacitor;

a carrier having a thickness less than that of the integrated circuit and capacitor, said carrier defining shallow cavities for accommodating each of said integrated circuit and capacitor; and electrical connectors connecting said at least one integrated circuit and capacitor.

2. The assembly, as set forth in claim 1, further comprising an adhesive securing said integrated circuit and capacitor in said shallow cavities.

3. The assembly, as set forth in claim 1, further comprising a solder securing said integrated circuit and circuit component in said shallow cavities.

4. The assembly, as set forth in claim 1, wherein said cavities are properly sized to friction fit said integrated circuit and circuit component.

5. The assembly, as set forth in claim 1, wherein said electrical connectors include metallic caps formed in said carrier, disposed around an opening of said cavity and intimately contacting terminals of said circuit component.

6. The assembly, as set forth in claim 5, further comprising a conductive adhesive disposed at an interface between said metallic caps and circuit component terminals.

7. The assembly, as set forth in claim 1, wherein said electrical connectors include wires.

8. The assembly, as set forth in claim 1, wherein said electrical connectors include ribbons.

9. The assembly, as set forth in claim 1, wherein said electrical connectors include a flexible substrate with conducting lµmeads.

10. The assembly, as set forth in claim 1, wherein the assembly height does not exceed 760 μm.

11. A method of assembly of integrated circuits and circuit components to not exceed 760 μm package thickness, comprising the steps of:

preparing a carrier of between 200 and 400 μm by defining a cavity of appropriate size and dimensions for each of said integrated circuits and circuit components;

positioning and securing said integrated circuits and circuit components in said respective cavities; and electrically connecting said integrated circuits and circuit components.

12. The assembly method, as set forth in claim 11, wherein said positioning and securing step includes the steps of:

dispensing an adhesive in said cavities prior to positioning said integrated circuits and circuit components therein; and curing said adhesive.

13. The assembly method, as set forth in claim 12, wherein said adhesive includes solder.

14. The assembly method, as set forth in claim 11, further comprising the steps of:

applying an adhesive to said integrated circuits and circuit components and carrier after said positioning step; and curing said adhesive.

15. The assembly method, as set forth in claim 14, wherein said adhesive includes solder.

16. The assembly method, as set forth in claim 11, wherein said electrically connecting step includes the step of wire bonding.

17. The assembly method, as set forth in claim 11, wherein said electrically connecting step includes the step of ribbon bonding.

18. The assembly method, as set forth in claim 11, further comprising the steps of:

forming conductive leads on said carrier and extending from said cavity; and positioning a circuit component in said cavity where terminals thereof intimately contact said conductive leads.

19. The assembly method, as set forth in claim 18, wherein said conductive lead forming step includes the step of forming said conductive leads on at least a portion of vertical walls of said cavity.

20. The assembly method, as set forth in claim 18, further comprising the step of dispensing a conductive adhesive at an interface between said conductive leads and said terminals.

21. The assembly method, as set forth in claim 18, further comprising the step of dispensing a solder at an interface between said conductive leads and said terminals.

22. The assembly method, as set forth in claim 18, further comprising the step of forming a conductive bond at an interface between said conductive leads and said terminals.

\* \* \* \* \*